(12) United States Patent
Kang et al.

(10) Patent No.: US 6,638,691 B2
(45) Date of Patent: Oct. 28, 2003

(54) METHOD FOR FABRICATING PLATE TYPE MAGNETIC RESISTANCE SENSOR CHIP ELEMENT

(75) Inventors: Eung-Cheon Kang, Suwon (KR); Ho-Chul Joung, Yongin (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 189 days.

(21) Appl. No.: 09/957,613

(22) Filed: Sep. 21, 2001

(65) Prior Publication Data

US 2002/0192599 A1 Dec. 19, 2002

(30) Foreign Application Priority Data

Jun. 1, 2001 (KR) .......................... 2001-30747

(51) Int. Cl.[7] .................. G03C 5/00; G11B 5/127; G11B 5/33
(52) U.S. Cl. .................. 430/313; 430/314; 430/317; 430/318; 430/322; 29/592.1; 29/603.13; 29/603.14; 360/313; 360/315
(58) Field of Search .................. 430/313, 314, 430/317, 318, 322; 29/592.1, 603.13, 603.14; 360/313, 315

(56) References Cited

U.S. PATENT DOCUMENTS

| | | | | |
|---|---|---|---|---|
| 3,908,194 A | * | 9/1975 | Romankiw ................. | 360/317 |
| 4,802,043 A | * | 1/1989 | Sato et al. ................. | 360/316 |
| 5,049,809 A | * | 9/1991 | Wakatsuki et al. ......... | 324/117 R |
| 5,274,521 A | * | 12/1993 | Miyauchi et al. ........... | 360/119 |
| 6,075,710 A | | 6/2000 | Lau ............................ | 361/760 |

* cited by examiner

Primary Examiner—Mark F. Huff
Assistant Examiner—Daborah Chacko Davis
(74) Attorney, Agent, or Firm—Lowe Hauptmann Gilman & Berner LLP

(57) ABSTRACT

Disclosed is a method for fabricating a plate-type magnetic resistance sensor chip simply and easily. First, a characteristic membrane composed of NiCo and NiFe is deposited over a surface of a glass wafer, exposed to light, and etched in a predetermined pattern to establish sensing parts. Then, a protective film is formed atop each of the sensing parts by depositing a $SiO_2$ membrane over the glass wafer, exposing the $SiO_2$ membrane to light, and etching the $SiO_2$ membrane in the same pattern as in the sensing part. The resulting structure is subjected to sand blasting to form through-holes at every corner of the sensing parts. A NiFe film is deposited around the through-holes on both sides of the glass wafer and within the through-holes to form conductors. Finally, the glass wafer is diced into individual rectangular magnetic resistance sensor chips in such a way that each magnetic resistance sensor chip has four arc corners with a NiFe conductor established at every arch corner on both sides of the wafer glass, the NiFe conductor serving as a terminal part.

7 Claims, 7 Drawing Sheets

METHOD FOR FABRICATING PLATE TYPE MAGNETIC RESISTANCE SENSOR CHIP ELEMENT

BACKGROUND OF THE INVENTION

1. Field of the Invention

The present invention relates to a method for fabricating a plate-type magnetic resistance (hereinafter referred to as "MR") sensor chip element, which is used for controlling rotational speeds of capstan motors for use in VCR, camcoders, and the like. More particularly, the present invention relates to the use of a glass wafer in fabricating a plate-type MR sensor chip simply and easily.

2. Description of the Prior Art

In order to better understand the background of the invention, a description will be given of a fabrication method of a conventional MR sensor chip in conjunction with FIG. 1. For the fabrication of a conventional MR sensor chip, to begin with, sensing parts 21, serving as characteristic membrane detectors, are formed on a ceramic glass sheet 11 while terminal parts are patterned on one end of the ceramic glass sheet 11, as illustrated in FIG. 1. The resulting structure is diced into individual rectangular MR sensor chips 20.

Each rectangular MR sensor chip is bonded onto a chip holder 30 made of an insert injection via an adhesive. A lead frame 30 is connected to the terminal part 22 of the MR sensor chip 20 by soldering, followed by coating an epoxy resin 50 over the terminal part to protectively insulate the solder connection between the lead frame 30 and the terminal part 22.

The conventional MR sensor chip 20 fabricated as in above is mounted at one side of a magnet 70 on a motor board 60 in such a way that the MR sensor chip 20 stands facing the magnet to control the rotational speed of the magnet 70, as shown in FIG. 1.

As disclosed in the above description, the fabrication of the conventional MR sensor chip requires complex processes, including insert injection for molding the chip holder 10 for fixing the MR sensor chip 20, soldering for connecting the lead frame 30 to the terminal part of the MR sensor chip 20, and application of the epoxy resin 50 to insulate the soldering portion.

Particularly, the ceramic glass sheet 11 of the MR sensor chip 20 is expensive and thus imposes an economic burden on both manufacturers and consumers. Both the sensing part 21 and the terminal part 22 are integrally formed onto the ceramic glass sheet 11. However, since the terminal part 22 protrudes from the surface of the ceramic glass sheet 11, insulating epoxy resin 50 is required to be applied on the soldering 40, but this treatment makes the terminal part 22 more prominent. When the MR sensor chip 20 fixed to the chip holder 10 is mounted onto the motor board 60, there occurs interference between the magnet, serving as a rotor, and the projection of the epoxy resin coated on the terminal part 22.

A solution to this problem is the use of processed ceramic wafers or photosensitive glass which allows the terminal part to be formed on the back side. However, this solution is economically unfavorable because the substrates are very expensive and the fabricating process is complicated.

SUMMARY OF THE INVENTION

Therefore, it is an object of the present invention to overcome the above problems encountered in prior arts and to provide a method for fabricating an MR sensor chip easily and simply.

It is another object of the present invention to provide a method for fabricating a plate type MR sensor chip which is structured to have a terminal part on both sides thereof and thus can be mounted onto a board of a magnet without the aid of a separate holder.

Based on the present invention, the above objects could be accomplished by a provision of a method for fabricating a plate type magnetic resistance sensor chip, comprising the steps of: establishing sensing parts by depositing a characteristic membrane composed of NiCo and NiFe at 200 to 500° C. to a thickness less than 1,000 Å(Angstrom) on a surface of a glass wafer, exposing the membrane to light, and etching the membrane in a predetermined pattern; forming a protective film atop each of the sensing parts by depositing a $SiO_2$ membrane to a thickness of 0.2 to 0.7 $\mu$m over the glass wafer, exposing the $SiO_2$ membrane to light, and etching the $SiO_2$ membrane in the same pattern as in the sensing part; subjecting the resulting structure to sand blasting to form through-holes at every corner of the sensing parts; depositing a NiFe film around the through-holes on both sides of the glass wafer and within the through-holes; and dicing the glass wafer into individual rectangular magnetic resistance sensor chips in such a way that each magnetic resistance sensor chip has four arc corners with a NiFe conductor established at every arch corner on both sides of the wafer glass, said NiFe conductor serving as a terminal part.

BRIEF DESCRIPTION OF THE DRAWINGS

The above and other objects, features and other advantages of the present invention will be more clearly understood from the following detailed description taken in conjunction with the accompanying drawings, in which.

PREFERRED EMBODIMENTS OF THE INVENTION

Figure 1:
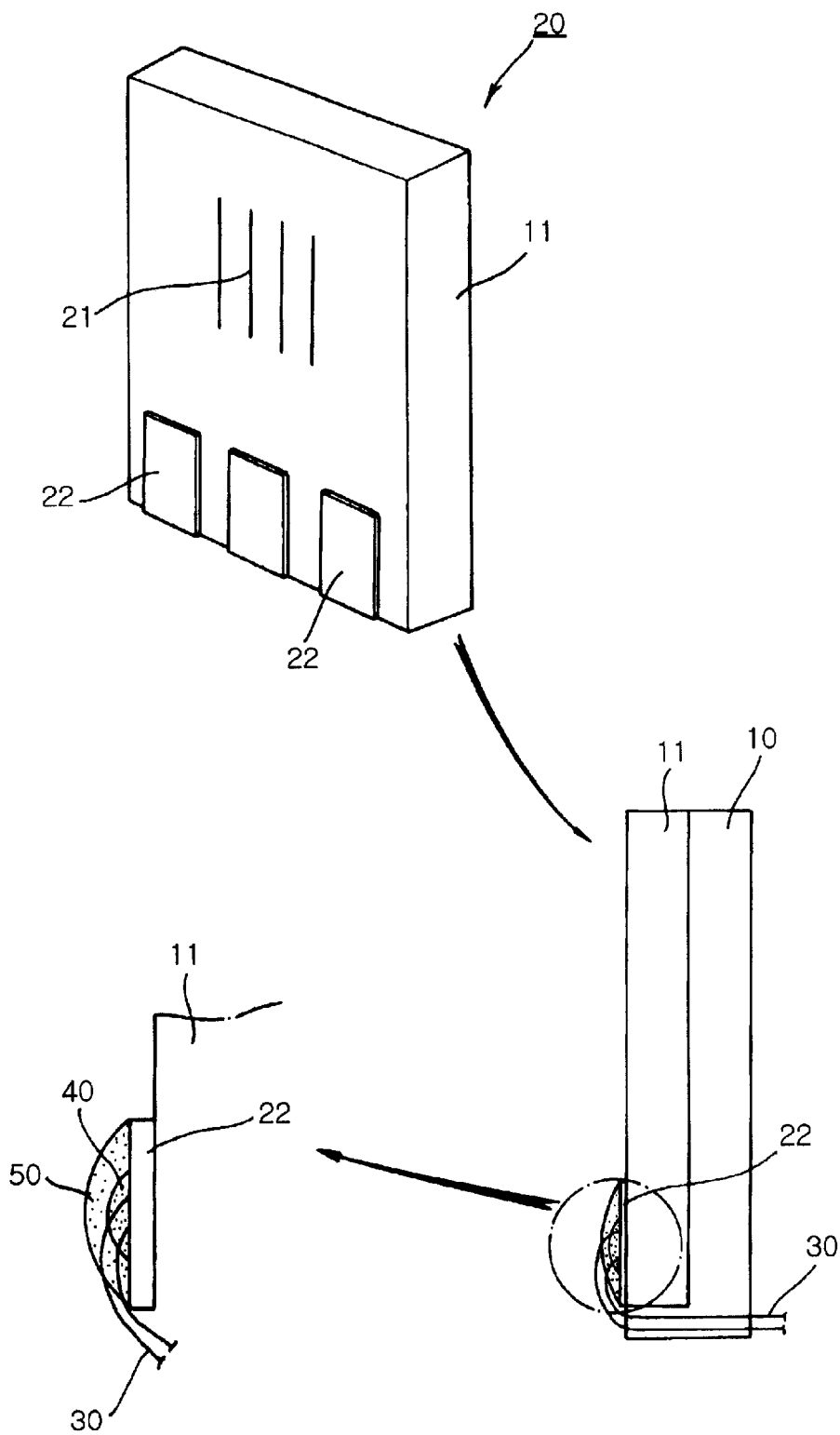
FIG. 1 is a perspective view showing a conventional MR sensor chip.

The application of the preferred embodiments of the present invention is best understood with reference to the accompanying drawings, wherein like reference numerals are used for like and corresponding parts, respectively.

Referring to FIG. 2, there is illustrated a method for fabricating a double-sided MR sensor chip in accordance with the present invention.

Figure 2A:
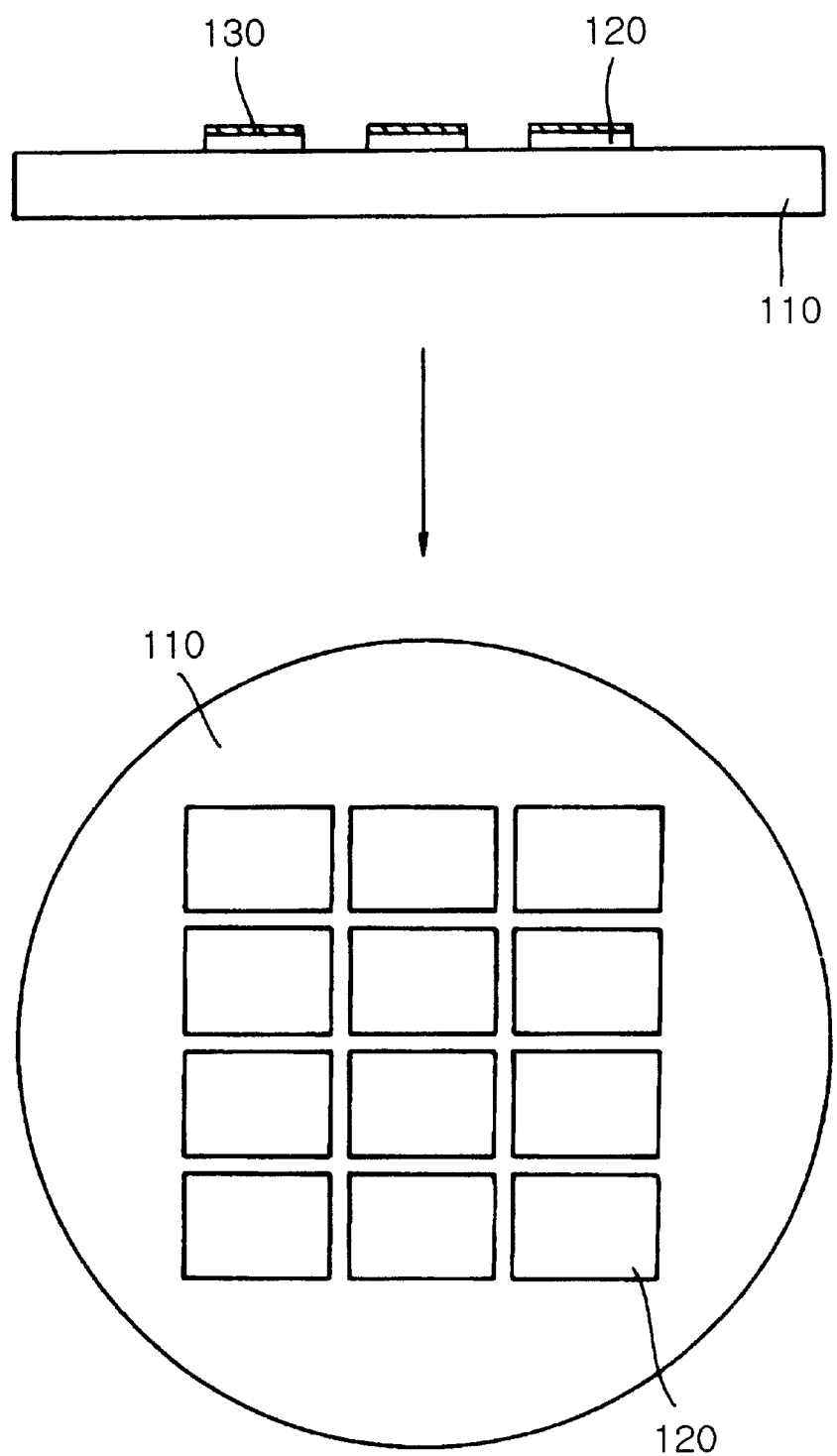
FIGS. 2a to 2e are schematic cross sectional and plane views showing processes of fabricating a plate-type MR sensor chip in accordance with the present invention.

To begin with, a characteristic membrane composed of NiCo and NiFe is deposited to a thickness less than 1,000 Å on a glass wafer 110, exposed to light, and etched to form a characteristic membrane pattern, which constitutes sensing parts 12, as seen in FIG. 2a.

The deposition of the characteristic membrane composed of NiCo and NiFe is preferably carried out at 200–500° C. For example, if the deposition temperature is below 200° C., the characteristic membrane is deposited with poor adhesion onto the glass wafer 110 and thus easily delaminated. On the other hand, when the deposition is carried out at higher than 500° C., the characteristic membrane is deformed owing to the heat. More preferably, the deposition temperature falls within the range of 300 to 400° C.

Subsequently, a $SiO_2$ membrane is deposited to a thickness of 0.2 to 0.7 $\mu$m over the glass wafer 110, exposed to light, and etched in the same pattern as the sensing parts 120 to form protective films 130, as seen in FIG. 2a.

Figure 2B:
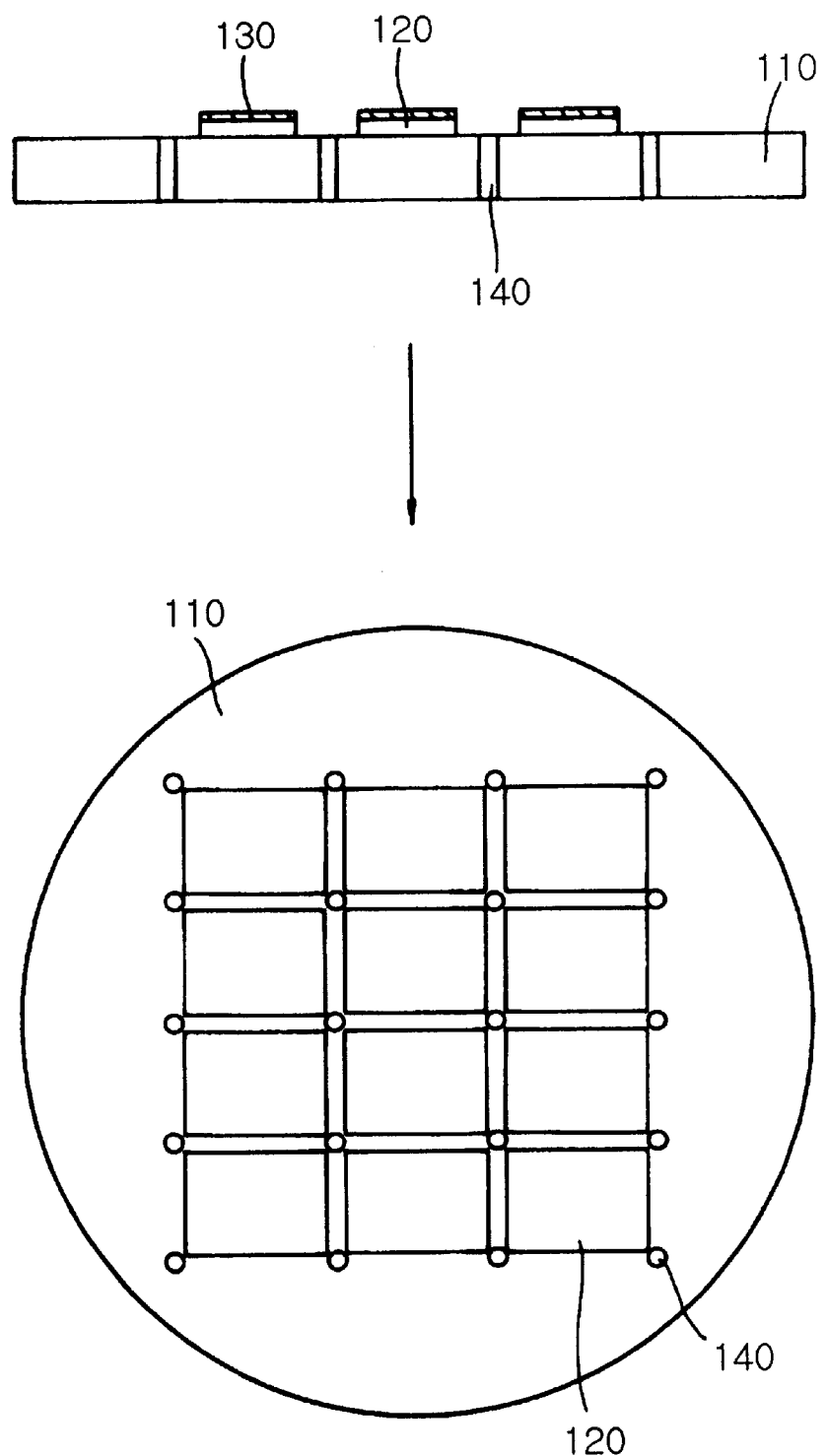

After the formation of the protective films 130 on the sensing parts 120 patterned on the glass wafer 110, it is subjected to sand blasting to establish through-holes 140, as shown in FIG. 2b. To this end, a photosensitive dry film is applied onto the glass, exposed to light, and developed in such a pattern that the dry film is removed at predetermined locations, e.g. at every corner of the sensing parts, against which sand particles collide to form holes while being protected in the other areas. As will be explained later, the through-holes 140 play an important role in forming terminal parts on the opposite sides of the glass wafer 110.

Preferably, the sand blasting is conducted once on each side, thus twice in all, to ensure the formation of the through-holes 140.

Figure 2C:
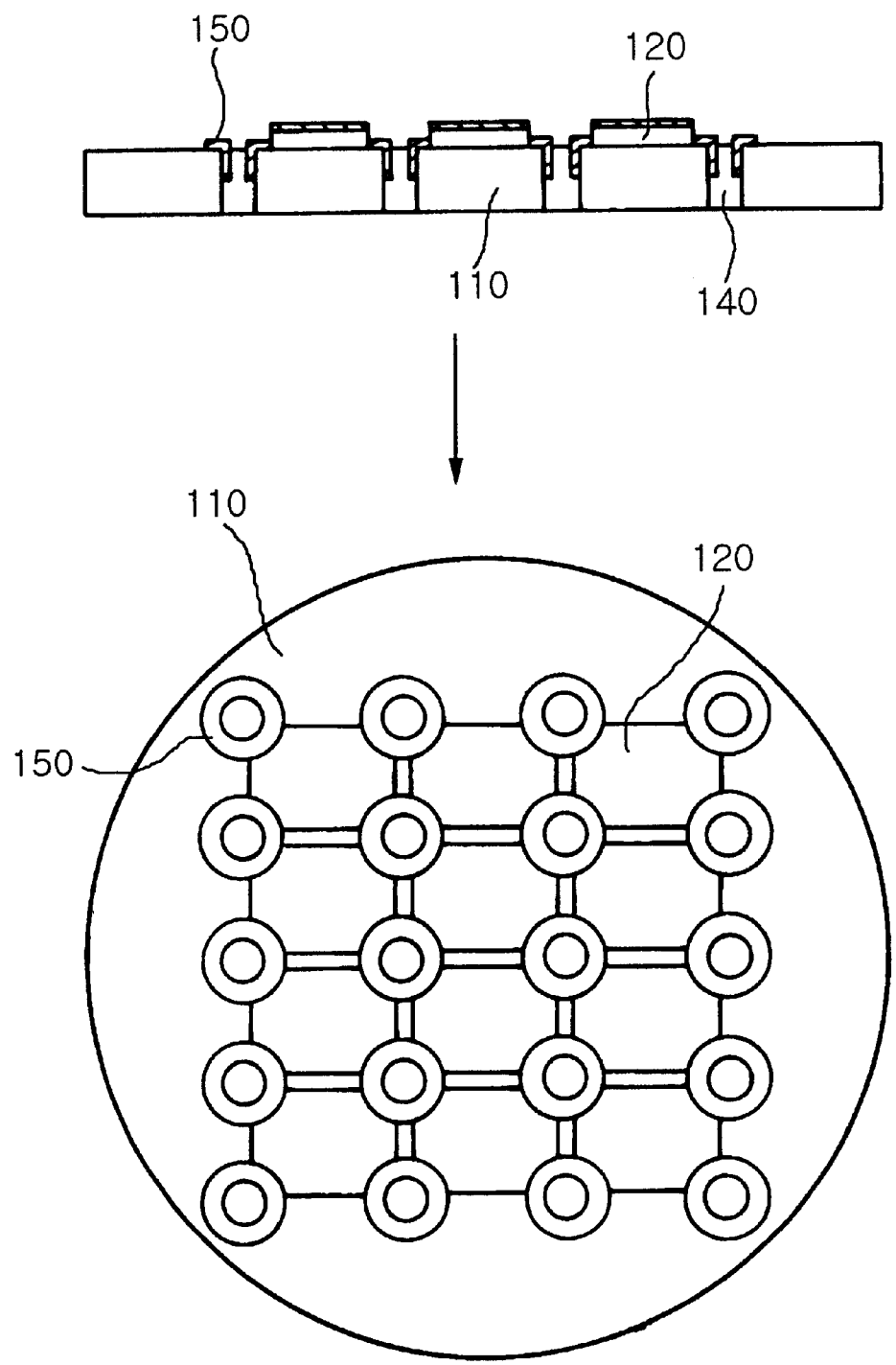
Figure 2D:
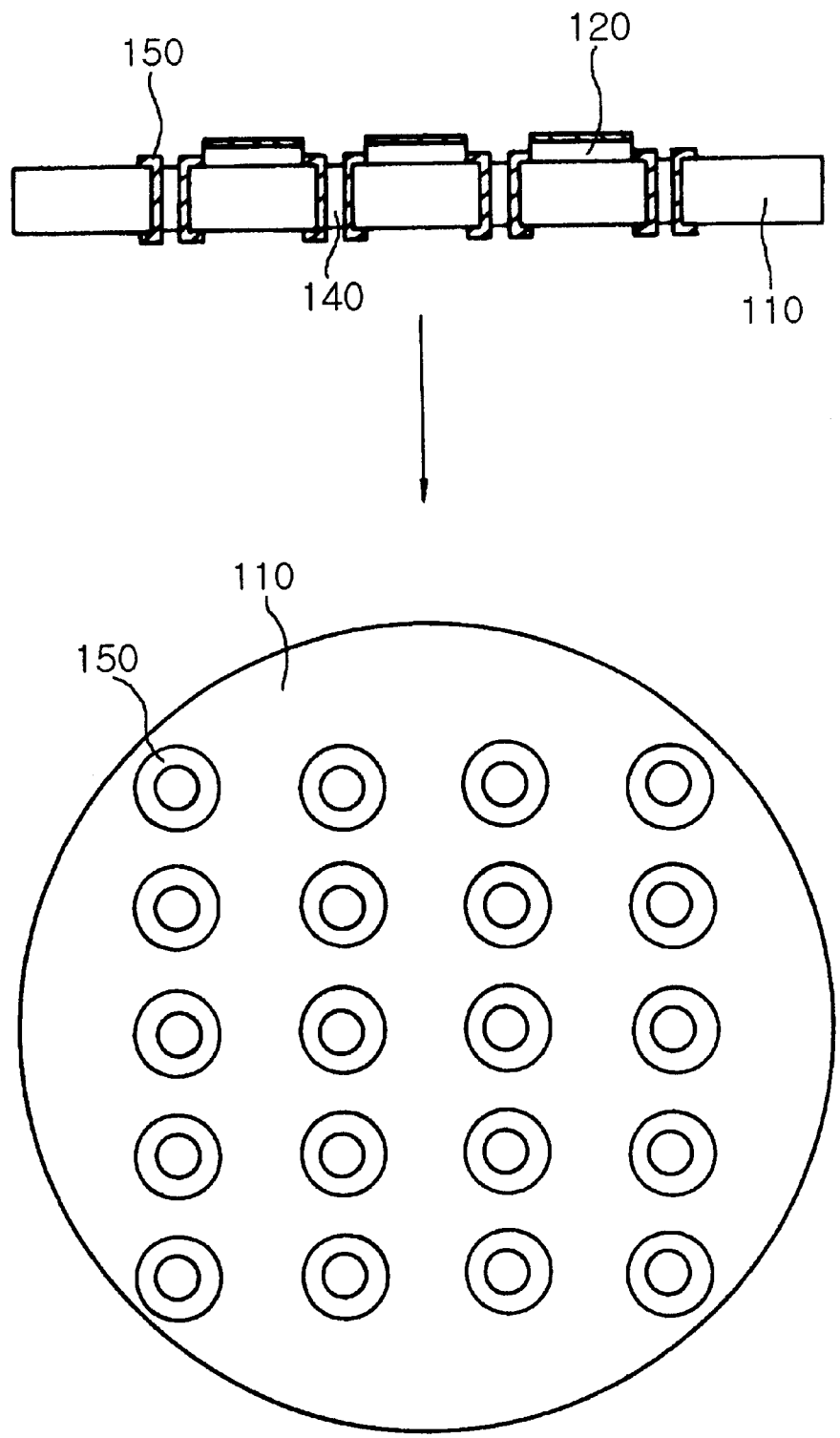

Next, metal masks of NiFe are let to stick fast to the glass wafer 110 locally around the through-holes 140 on both sides and along the side wall of the through-holes 140 to form conductors 150 that serve as terminal parts. For formation of the conductors 150 around the through-holes 140 and along the side walls of the through-holes 120, NiFe is deposited once on each side of the glass wafer 110, as shown in FIGS. 2c and 2d. The deposition is carried out at 150 to 250° C. until the conductors 150 have a thickness of 4,500 to 5,500 Å.

Following the deposition of the conductors, SnPb plating is carried out. Over the total area of the resulting structure is applied a protective coat of an epoxy resin, followed by performing baking at 130 to 150° C. to make the conductors adhere closely to the through-holes.

Figure 2E:
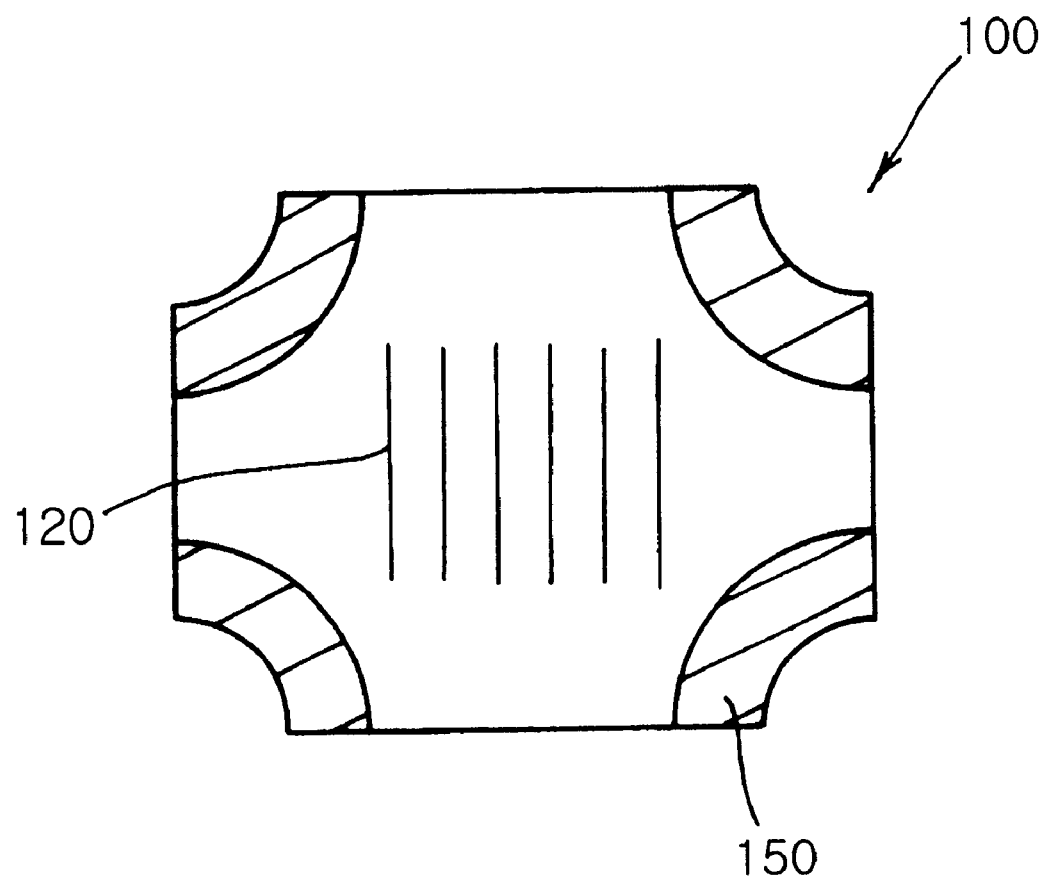

FIG. 2e is a schematic view showing an MR sensor chip 100, which is obtained by dicing the glass wafer 110 having through-holes coated with the conductors into individual MR sensor chips.

Figure 3:
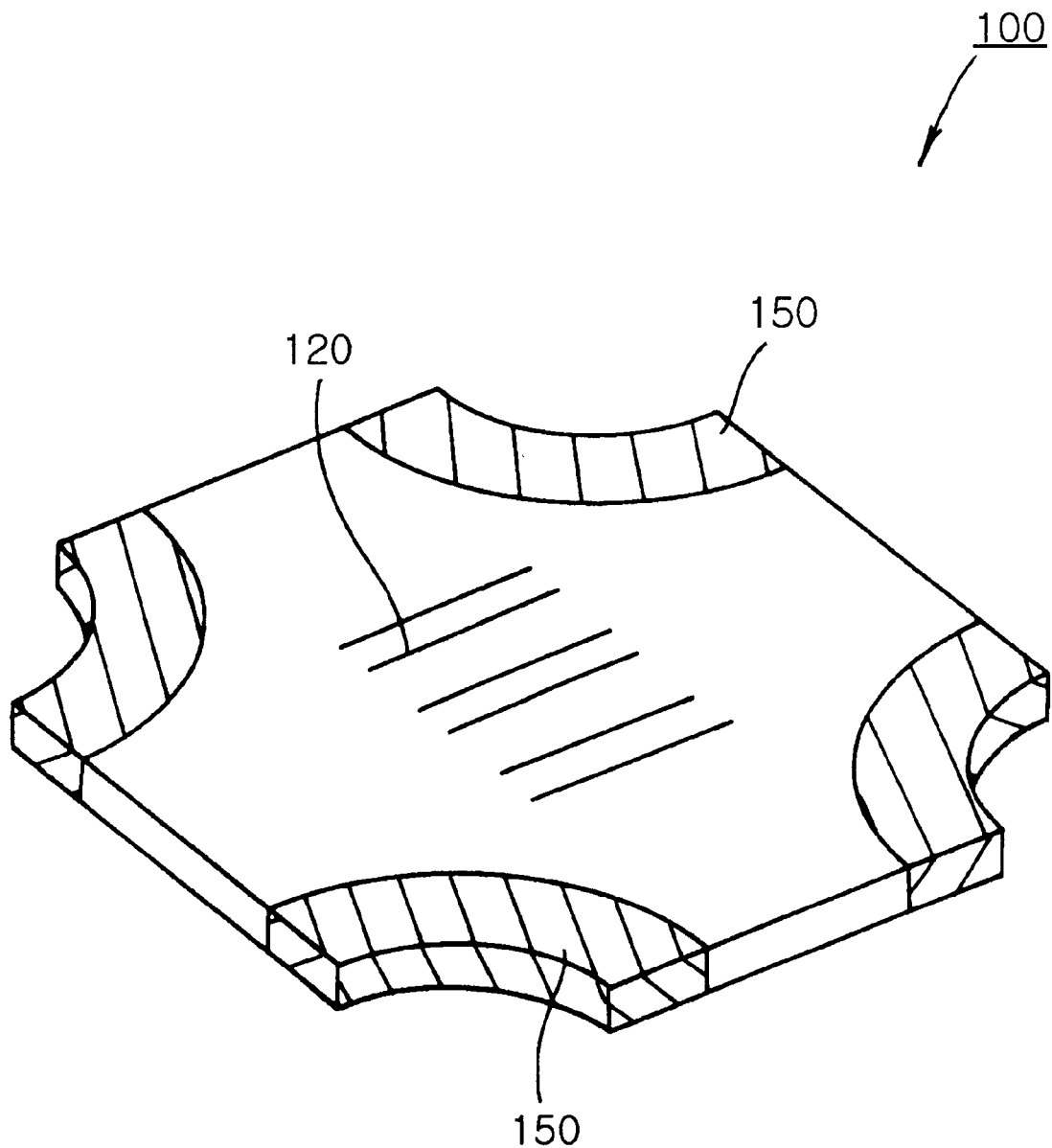
FIG. 3 is a perspective view showing a plate-type MR sensor fabricated by the method of the present invention.

With reference to FIG. 3, there is shown the plate type MR sensor chip 100 in perspective view. As seen in this figure, the MR sensor chip 100 is fabricated with a glass wafer 110 which has a sensing part 120 thereon and a terminal connecting part locally at its arc corners on both sides thereof.

As described hereinbefore, a double-sided MR sensor chip having a terminal part on both sides of a glass wafer can be fabricated with ease according to the method the present invention provides. Accordingly, the MR sensor chip has a plate shape. With such a structure, the plate type MR sensor chip can be associated with a printed circuit board (PCB) and thus mounted onto a board of a magnet without requiring a separate holder. In addition, the method of the present invention enjoys the advantage of being performed in a very simple process, relative to conventional methods.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method for fabricating a plate type magnetic resistance sensor chip, comprising the steps of:
    establishing sensing parts by depositing a characteristic membrane composed of NiCo and NiFe on a surface of a glass wafer, exposing the membrane to light, and etching the membrane in a predetermined pattern;
    forming a protective film atop each of the sensing parts by depositing a $SiO_2$ membrane over the glass wafer, exposing the $SiO_2$ membrane to light, and etching the $SiO_2$ membrane in the same pattern as in the sensing part;
    subjecting the resulting structure to sand blasting to form through-holes at every corner of the sensing parts;
    depositing a NiFe film around the through-holes on both sides of the glass wafer and within the through-holes; and
    dicing the glass wafer into individual rectangular magnetic resistance sensor chips in such a way that each magnetic resistance sensor chip has four arc corners with a NiFe conductor established at every arch corner on both sides of the glass wafer, said NiFe conductor serving as a terminal part.

2. The method as set forth in claim 1, wherein the depositing of the characteristic membrane composed of NiCo and NiFe is carried out at 200 to 500° C. to a thickness less than 1,000 Å.

3. The method as set forth in claim 1, wherein the $SiO_2$ membrane is deposited to a thickness of 0.2 to 0.7 μm.

4. The method as set forth in claim 1, wherein the sand blasting step is carried out by applying a photosensitive dry film onto the glass, exposing the photosensitive film to light, and developing the exposed photosensitive film in such a pattern that the dry film is removed at predetermined locations against which sand particles collide to form holes while being protected in the other areas.

5. The method as set forth in claim 1, wherein the sand blasting step is conducted once on each side of the glass wafer, thus twice in all, to ensure the formation of the through-holes.

6. The method as set forth in claim 1, wherein the depositing of the NiFe film is carried out by coating metal masks of NiFe locally around the through-holes on both sides and along the side walls of the through-holes to form conductors that serve as terminal parts at 150 to 250° C. to a thickness of 4,500 to 5,500 Å.

7. The method as set forth in claim 6, further comprising the step of making the conductors stick fast to the through-holes by plating SnPb onto the through-holes, coating the conductors with a protective epoxy resin, and baking the glass wafer at 130 to 150° C., before the dicing step.

\* \* \* \* \*